(12) United States Patent
Peng

(10) Patent No.: US 12,354,673 B2
(45) Date of Patent: Jul. 8, 2025

(54) LATCH TYPE SENSE AMPLIFIER FOR NON-VOLATILE MEMORY

(71) Applicant: eMemory Technology Inc., Hsin-Chu (TW)

(72) Inventor: Hsin-Chan Peng, Hsinchu County (TW)

(73) Assignee: EMEMORY TECHNOLOGY INC., Hsin-Chu (TW)

( * ) Notice: Subject to any disclaimer, the term of this patent is extended or adjusted under 35 U.S.C. 154(b) by 147 days.

(21) Appl. No.: 18/387,476

(22) Filed: Nov. 7, 2023

(65) Prior Publication Data
US 2024/0161811 A1 May 16, 2024

Related U.S. Application Data

(60) Provisional application No. 63/424,966, filed on Nov. 14, 2022.

(51) Int. Cl.
*G11C 7/06* (2006.01)
*G11C 13/00* (2006.01)
*G11C 16/26* (2006.01)
*G11C 16/28* (2006.01)

(52) U.S. Cl.
CPC ............. *G11C 16/26* (2013.01); *G11C 7/065* (2013.01); *G11C 13/004* (2013.01); *G11C 16/28* (2013.01); *G11C 2013/0042* (2013.01)

(58) Field of Classification Search
CPC ....... G11C 16/26; G11C 7/065; G11C 13/004; G11C 16/28; G11C 2013/0042; G11C 7/062; G11C 16/24
See application file for complete search history.

(56) References Cited

U.S. PATENT DOCUMENTS

| | | | | |
|---|---|---|---|---|
| 6,356,120 B1* | 3/2002 | Graetz | ................ | G11C 11/4091 327/55 |
| 6,754,121 B2* | 6/2004 | Worley | .................. | G11C 7/065 365/207 |
| 7,327,621 B2 | 2/2008 | Lin et al. | | |
| 10,192,611 B1* | 1/2019 | Yang | ................... | G11C 11/4096 |
| 11,295,788 B2* | 4/2022 | Ku | .......................... | G11C 16/14 |

(Continued)

FOREIGN PATENT DOCUMENTS

TW   200400691 A   1/2004

*Primary Examiner* — Jay W. Radke
(74) *Attorney, Agent, or Firm* — WPAT, PC

(57) ABSTRACT

A latch type sense amplifier includes three transistors, a latching device and two capacitors. The two drain/source terminals of the first transistor are connected with a first node and a second node. The gate terminal of the first transistor receives a reference voltage. The two drain/source terminals of the second transistor are connected with the first node and a third node. The gate terminal of the second transistor is connected with a data line. The two drain/source terminals of the third transistor are connected with a first supply voltage and the first node. The gate terminal of the third transistor receives an enable signal. The latching device is connected with the second node and the third node. The first capacitor is connected between gate terminals of the third transistor and the first transistor. The second capacitor is connected between gate terminals of the third transistor and the second transistor.

12 Claims, 6 Drawing Sheets

(56) References Cited

U.S. PATENT DOCUMENTS

2013/0051114 A1* 2/2013 Kim .................. G11C 7/08
 365/158
2019/0164579 A1* 5/2019 Glazewski ............ G11C 11/221
2021/0050039 A1* 2/2021 Ku .................. G11C 16/14

* cited by examiner

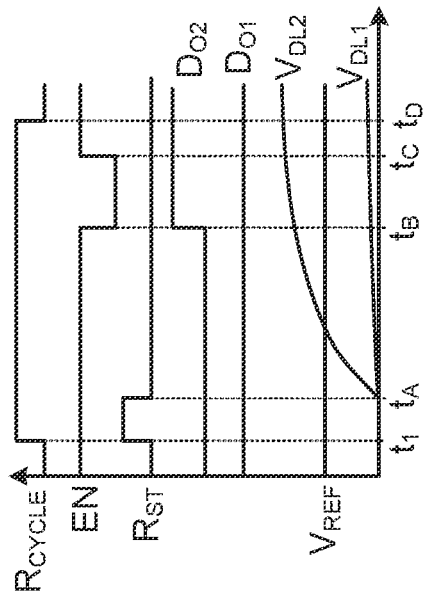
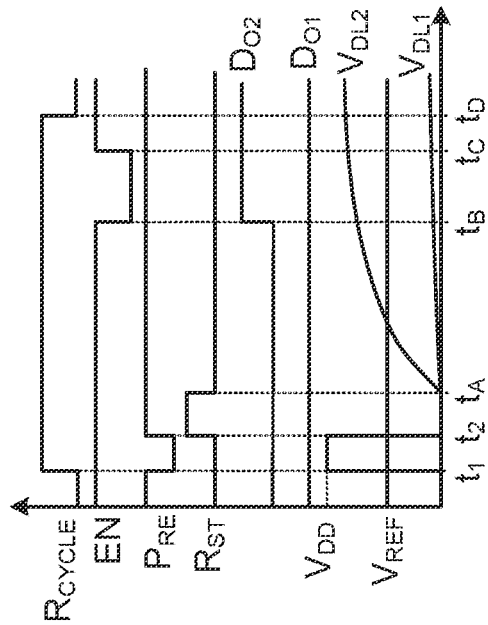
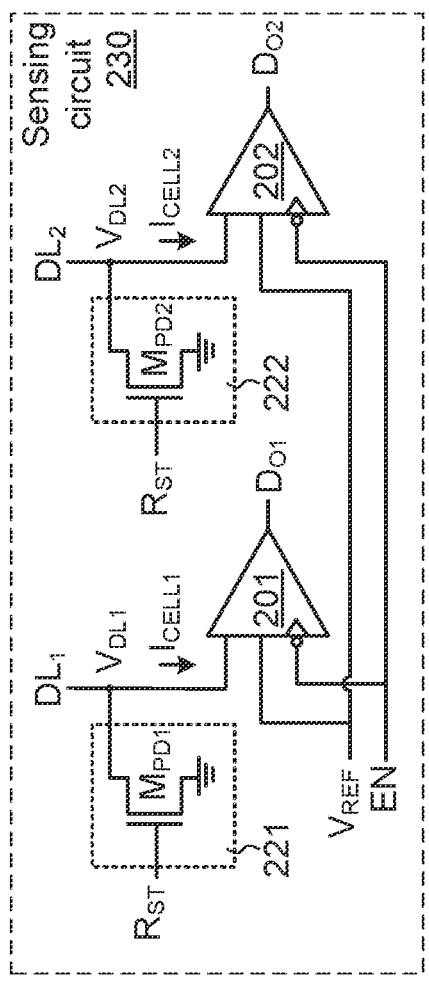
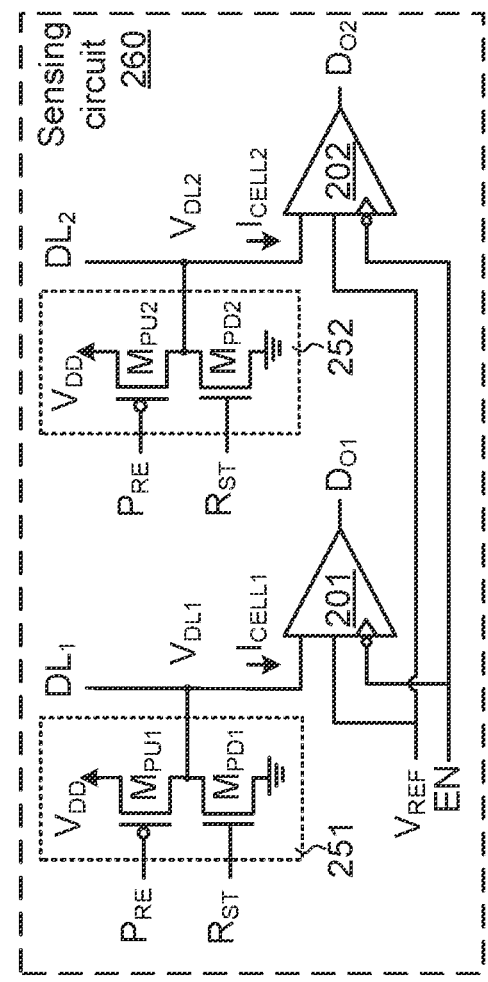

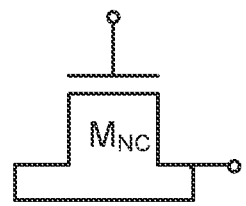
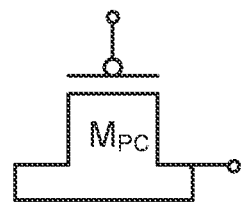
FIG. 9A      FIG. 9B
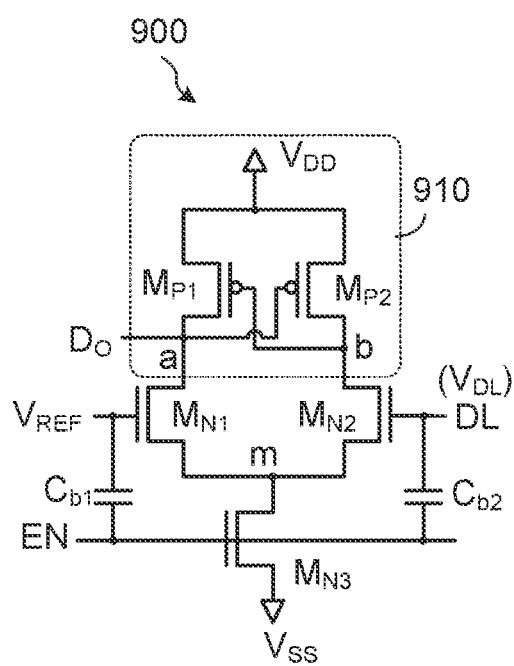
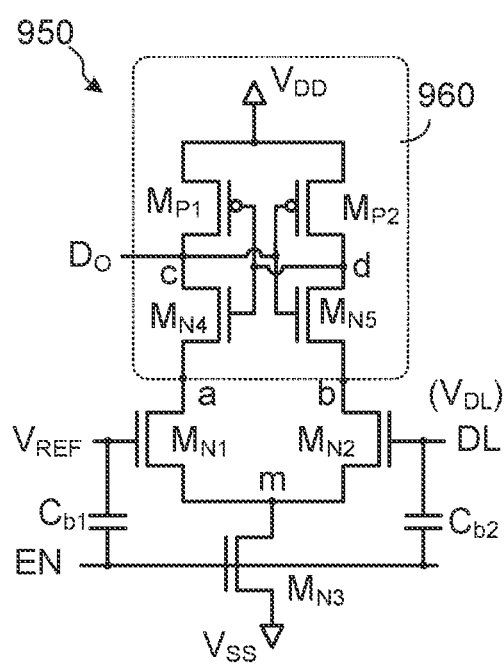
FIG. 10A      FIG. 10B

LATCH TYPE SENSE AMPLIFIER FOR NON-VOLATILE MEMORY

This application claims the benefit of U.S. provisional application Ser. No. 63/424,966, filed Nov. 14, 2022, the subject matters of which are incorporated herein by references.

FIELD OF THE INVENTION

The present invention relates to a sense amplifier, and more particularly to a latch type sense amplifier for a non-volatile memory.

BACKGROUND OF THE INVENTION

As is well known, a memory cell array of a non-volatile memory comprises plural memory cells. Each memory cell comprises a storage device. For example, the storage device includes a floating gate transistor or a resistive element. The operations of the floating gate transistor and the resistive element will be described briefly as follows.

Generally, the floating gate transistor comprises a floating gate to store hot carriers. The storing state of the floating gate transistor may be determined according to the amount of the stored hot carriers. For example, in a program cycle of the non-volatile memory, a threshold voltage of the floating gate transistor may be changed by controlling the amount of the injected hot carriers, and the storing state of the memory cell is correspondingly changed. When a read action is performed, a read voltage is provided to the floating gate transistor, and thus a cell current (also referred as a read current) is generated. According to the magnitude of the cell current, the storing state of the memory cell is determined to be a first storing state or a second storing state. For example, the floating gate transistor is an n-type transistor. If hot carriers are stored in the floating gate transistor, the cell current generated by the memory cell is very low (or nearly zero) when the read action is performed. Consequently, the storing state of the memory cell is regarded as the first storing state. Whereas, if no hot carriers are stored in the floating gate transistor, the cell current generated by the memory cell is relatively larger when the read action is performed. Consequently, the storing state of the memory cell is regarded as the second storing state.

The resistance of the resistive element can be switched between a high resistance and a low resistance. According to the resistance of the resistive element, the storing state of the resistive element can be determined. For example, in the program cycle of the non-volatile memory, various voltages are provided to control the resistance of the resistive element. When the read action is performed, a read voltage is provided to the resistive element, and thus a cell current (also referred as a read current) is generated. According to the magnitude of the cell current, the storing state of the memory cell is determined to be a first storing state or a second storing state. Moreover, the non-volatile memory further comprises a sensing circuit for receiving the cell current from the memory cell and judging the storing state of the memory cell.

SUMMARY OF THE INVENTION

An embodiment of the present invention provides a latch type sense amplifier for a non-volatile memory. A selected memory cell of the non-volatile memory is connected with a data line. The latch type sense amplifier includes a first transistor, a second transistor, a third transistor, a latching device, a first capacitor and a second capacitor. A first drain/source terminal of the first transistor is connected with a first node. A second drain/source terminal of the first transistor is connected with a second node. A gate terminal of the first transistor receives a reference voltage. The gate terminal of the first transistor is a first input terminal of the latch type sense amplifier. A first drain/source terminal of the second transistor is connected with the first node. A second drain/source terminal of the second transistor is connected with a third node. A gate terminal of the second transistor is connected with the data line. The gate terminal of the second transistor is a second input terminal of the latch type sense amplifier. A first drain/source terminal of the third transistor receives a first supply voltage. A second drain/source terminal of the third transistor is connected with the first node. A gate terminal of the third transistor receives an enable signal. The latching device is connected with the second node and the third node. A first terminal of the first capacitor is connected with the gate terminal of the third transistor. A second terminal of the first capacitor is connected with the gate terminal of the first transistor. A first terminal of the second capacitor is connected with the gate terminal of the third transistor. A second terminal of the second capacitor is connected with the gate terminal of the second transistor.

Numerous objects, features and advantages of the present invention will be readily apparent upon a reading of the following detailed description of embodiments of the present invention when taken in conjunction with the accompanying drawings. However, the drawings employed herein are for the purpose of descriptions and should not be regarded as limiting.

BRIEF DESCRIPTION OF THE DRAWINGS

The above objects and advantages of the present invention will become more readily apparent to those ordinarily skilled in the art after reviewing the following detailed description and accompanying drawings, in which:

FIG. 3A is a schematic circuit diagram illustrating another exemplary sensing circuit used in the non-volatile memory of the present invention;

FIG. 3B is a schematic timing waveform diagram illustrating associated signals of the sensing circuit as shown in FIG. 3A;

FIG. 4A is a schematic circuit diagram illustrating a further exemplary sensing circuit used in the non-volatile memory of the present invention;

FIG. 4B is a schematic timing waveform diagram illustrating associated signals of the sensing circuit as shown in FIG. 4A;

FIGS. 9A and 9B schematically illustrate two other possible examples of the anti-couple devices used in the sense amplifier of the present invention;

FIG. 10A is a schematic circuit diagram illustrating a sense amplifier according to a fifth embodiment of the present invention; and FIG. 10B is a schematic circuit diagram illustrating a sense amplifier according to a sixth embodiment of the present invention.

DETAILED DESCRIPTION OF PREFERRED EMBODIMENTS

Figure 1:
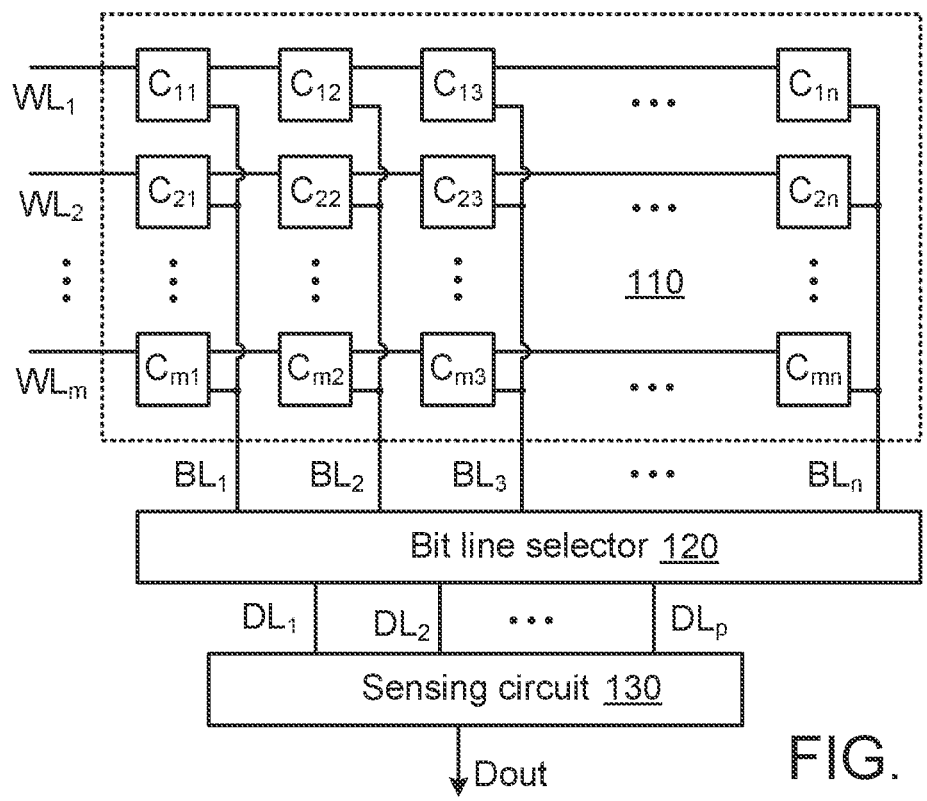
FIG. 1 is a schematic circuit diagram illustrating the architecture of a non-volatile memory.

FIG. 1 is a schematic circuit diagram illustrating the architecture of a non-volatile memory. As shown in FIG. 1, the non-volatile memory comprises a memory cell array 110, a bit line selector 120 and a sensing circuit 130. The memory cell array 110 comprises m×n memory cells $C_{11}$~$C_{mn}$, wherein m and n are positive integers.

Please refer to FIG. 1 again. In the memory cell array 110, the n memory cells $C_{11}$~$C_{1n}$ in the first row are connected with a word line $WL_1$. Moreover, the n memory cells $C_{11}$-$C_{1n}$ in the first row are respectively connected with corresponding n bit lines $B_{L1}$-$B_{Ln}$. The n memory cells $C_{21}$~$C_{2n}$ in the second row are connected with a word line $WL_2$. Moreover, the n memory cells $C_{21}$~$C_{2n}$ in the second row are respectively connected with the corresponding n bit lines $B_{L1}$-$B_{Ln}$. The rest may be deduced by analogy. Similarly, the n memory cells $C_{m1}$~$C_{mn}$ in the m-th row are connected with a word line $WL_m$. Moreover, the n memory cells $C_{m1}$~$C_{mn}$ in the m-th row are respectively connected with the corresponding n bit lines $B_{L1}$-$B_{Ln}$.

The bit line selector 120 is connected with the n bit lines $B_{L1}$~$B_{Ln}$ and p data lines $DL_1$~$DL_p$, wherein p is a positive integer smaller than or equal to n. When the read action of the non-volatile memory is performed, the bit line selector 120 selects p bit lines from the n bit lines $B_{L1}$~$B_{Ln}$. In addition, the selected p bit lines are connected with the corresponding p data lines $DL_1$~$DL_p$ through the bit line selector 120.

The sensing circuit 130 is connected with the p data lines $DL_1$~$DL_p$. When the read action is performed, the sensing circuit 130 receives the cell currents from the p data lines $DL_1$~$DL_p$ and generates a p-bit output data Dout to indicate the storing states of corresponding p selected memory cells. In other words, the sensing circuit 130 can judge the storing states of the p memory cells in the selected row.

For example, n is 32, and p is 8. When the read action is performed, the word line WL 1 is activated. In other words, the first row is the selected row. In a first sensing cycle of the read action, the bit lines $BL_1$~$BL_8$ are respectively connected with the data lines $DL_1$~$DL_8$ through the bit line selector 120. Consequently, the eight memory cells $C_{11}$~$C_{18}$ in the selected row are the selected memory cells. The cell currents generated by the selected memory cells $C_{11}$~$C_{18}$ flow to the sensing circuit 130. According to the cell currents from the data lines $DL_1$~$DL_8$, the sensing circuit 130 generates a one-byte output data Dout to indicate the storing states of the selected memory cells $C_{11}$~$C_{18}$.

Similarly, in the second, third and fourth sensing cycles of the read action, the bit lines $BL_9$~$BL_{16}$, $BL_{17}$~$BL_{24}$ and $BL_{25}$~$BL_{32}$ are respectively and sequentially connected with the data lines $DL_1$~$DL_8$ through the bit line selector 120. In addition, the sensing circuit 130 generates the corresponding output data Dout sequentially. According to the four output data Dout generated in the four sensing cycles, the sensing circuit 130 acquires the storing states of all memory cells $C1_{11}$~$C_{1n}$ in the first row (i.e., the first selected row). The operating principles of the sensing circuit 130 will be described as follows.

Figure 2A:
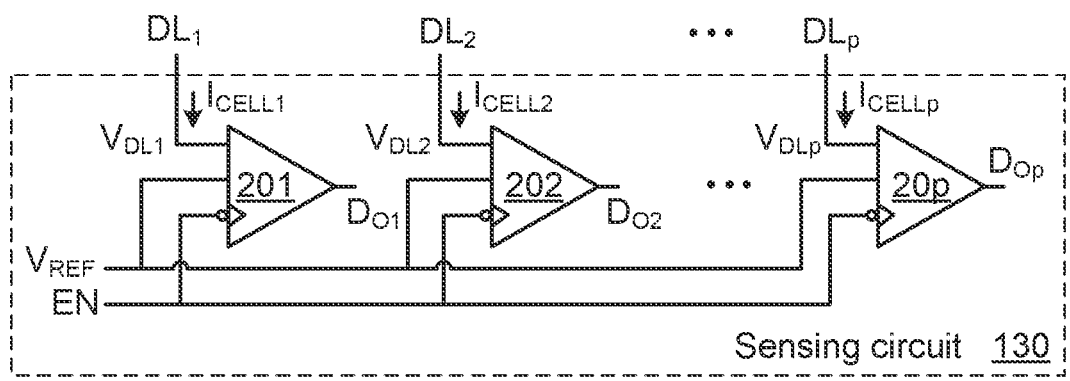
FIG. 2A is a schematic circuit diagram illustrating an exemplary sensing circuit used in the non-volatile memory of the present invention.
Figure 2B:
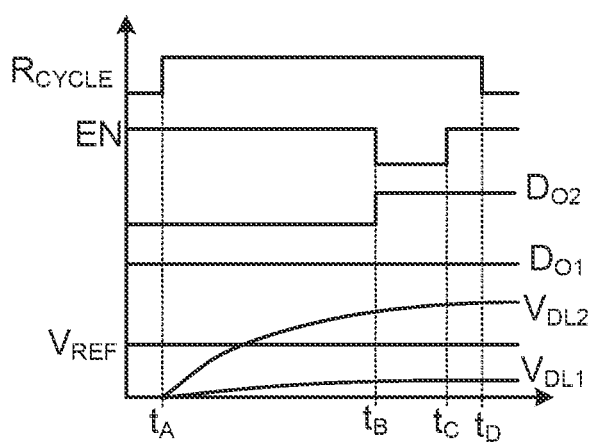
FIG. 2B is a schematic timing waveform diagram illustrating associated signals of the sensing circuit as shown in FIG. 2A.

FIG. 2A is a schematic circuit diagram illustrating an exemplary sensing circuit used in the non-volatile memory of the present invention. FIG. 2B is a schematic timing waveform diagram illustrating associated signals of the sensing circuit as shown in FIG. 2A. The sensing circuit 130 comprises p sense amplifiers 201~20p. The circuitry structures of the p sense amplifiers 201~20p are identical. The first input terminal of the sense amplifier 201 receives a reference voltage $V_{REF}$. The second input terminal of the sense amplifier 201 is connected with the data line $DL_1$. The enable terminal of the sense amplifier 201 receives an enable signal EN. The output terminal of the sense amplifier 201 generates an output signal $D_{O1}$. The first input terminal of the sense amplifier 202 receives the reference voltage $V_{REF}$. The second input terminal of the sense amplifier 202 is connected with the data line $DL_2$. The enable terminal of the sense amplifier 202 receives the enable signal EN. The output terminal of the sense amplifier 202 generates an output signal $D_{O2}$. The rest may be deduced by analogy. Similarly, the first input terminal of the sense amplifier 20p receives the reference voltage $V_{REF}$. The second input terminal of the sense amplifier 20p is connected with the data line $DL_p$. The enable terminal of the sense amplifier 20p receives the enable signal EN. The output terminal of the sense amplifier 20p generates an output signal Don. Moreover, the p output signals $D_{O1}$~$D_{Op}$ are collaboratively formed as the output data Dout.

In a read cycle, p selected memory cells in the selected row of the memory cell array 110 are respectively connected with the data lines $DL_1$~$DL_p$ through the bit line selector 120. The p selected memory cells respectively generate p cell currents $I_{CELL1}$~$I_{CELLp}$ to charge the corresponding data lines $DL_1$~$DL_p$. Consequently, the data lines $DL_1$~$DL_p$ respectively generate the corresponding charged voltages $V_{DL1}$~$V_{DLp}$. In other words, the changes of the charged voltages $V_{DL1}$~$V_{DLp}$ can be respectively determined according to the magnitudes of the cell currents $I_{CELL1}$~$I_{CELLp}$. Moreover, the storing states of the p selected memory cells are respectively determined by the p sense amplifiers 201~20p of the sensing circuit 130 according to the charged voltages $V_{DL1}$~$V_{DLp}$.

In another read cycle, other p selected memory cells in the selected row of the memory cell array 110 are respectively connected with the data lines $DL_1$~$DL_p$ through the bit line selector 120. The p selected memory cells respectively generate p cell currents $I_{CELL1}$~$I_{CELLp}$ to charge the corresponding data lines $DL_1$~$DL_p$. Consequently, the data lines $DL_1$-$DL_p$ respectively generate the corresponding charged voltages $V_{DL1}$~$V_{DLp}$. Moreover, the storing states of the p selected memory cells are respectively determined by the p sense amplifiers $201\sim20p$ of the sensing circuit 130 according to the charged voltages $V_{DL1}\sim V_{DLp}$.

Please refer to FIG. 2B. In the time interval between the time point $t_A$ and the time point $t_D$, a read cycle signal $R_{CYCLE}$ is in the high-level state to represent a read cycle. Generally, different bit lines $BL_1\sim BL_n$ are selected to be connected with the corresponding data lines $DL_1\sim DL_p$ through the bit line selector 120 according to the read cycle signal $R_{CYCLE}$. As shown in FIG. 2B, the read cycle contains a charging phase and a sensing phase.

The time interval between the time point $t_A$ and the time point $t_B$ is the charging phase. In the charging phase, the p selected memory cells respectively generate the p cell currents $I_{CELL1}\sim I_{CELLp}$ to charge the corresponding data lines $DL_1\sim DL_p$. Consequently, the data lines $DL_1\sim DL_p$ respectively generate the corresponding charged voltages $V_{DL1}\sim V_{DLp}$. For example, the cell current $I_{CELL1}$ is lower than the cell current $I_{CELL2}$. Consequently, as shown in FIG. 2B, the charged voltages $V_{DL1}$ on the data line $DL_1$ rises at a slower rate, and the charged voltages $V_{DL2}$ on the data line $DL_1$ rises at a faster rate.

The time interval between the time point $t_B$ and the time point $t_C$ is the sensing phase. In the sensing phase, the enable signal EN is switched from the high-level state to the low-level state, indicating that the enable signal EN is activated. Meanwhile, the sense amplifiers 201 and 202 are activated. Moreover, the storing states of the selected memory cells are respectively determined according to the relationship between the reference voltage $V_{REF}$ and the charged voltages $V_{DL1}$ and $V_{DL2}$. As shown in FIG. 2B, the charged voltage $V_{DL1}$ is lower than the reference voltage $V_{REF}$. Consequently, the output signal $D_{O1}$ outputted from the sense amplifier 201 has a first voltage level (e.g., a low voltage level). Moreover, as shown in FIG. 2B, the charged voltage $V_{DL2}$ is higher than the reference voltage $V_{REF}$. Consequently, the output signal $D_{O2}$ outputted from the sense amplifier 202 has a second voltage level (e.g., a high voltage level).

At the time point $t_D$, the read cycle is ended. Since the output signal $D_{O1}$ outputted from the sense amplifier 201 has the first voltage level (e.g., the low voltage level), it is confirmed that the selected memory cell connected with the data line $DL_1$ is in the first storing state. Since the output signal $D_{O2}$ outputted from the sense amplifier 202 has the second voltage level (e.g., the high voltage level), it is confirmed that the selected memory cell connected with the data line $DL_2$ is in the second storing state.

In another read cycle, other p selected memory cells in the selected row of the memory cell array 110 are respectively connected with the data lines $DL_1\sim DL_p$ through the bit line selector 120. The storing states of the p selected memory cells are respectively determined by these p sense amplifiers $201\sim20p$ of the sensing circuit 130 according to the charged voltages $V_{DL1}\sim V_{DLp}$. The operating principles are similar to those mentioned above, and not redundantly described herein.

In some embodiments, the sensing circuit 130 further comprises p auxiliary circuits. The p auxiliary circuits are respectively connected with the p data lines $DL_1\sim DL_p$. Due to the arrangement of the p auxiliary circuits, the initial voltages on all of the data lines $DL_1\sim DL_p$ are identical. For succinctness, only two auxiliary circuits connected with two corresponding sense amplifiers will be described.

FIG. 3A is a schematic circuit diagram illustrating another exemplary sensing circuit used in the non-volatile memory of the present invention. FIG. 3B is a schematic timing waveform diagram illustrating associated signals of the sensing circuit as shown in FIG. 3A. In FIG. 3B, the time interval between the time point $t_1$ and the time point $t_D$ is a read cycle. In the read cycle, a read cycle signal $R_{CYCLE}$ is in the high-level state. Moreover, the read cycle contains a reset phase, a charging phase and a sensing phase.

In comparison with the sensing circuit 130 shown in FIG. 2A, the sensing circuit 230 of this embodiment further comprises p auxiliary circuits. For succinctness, only two auxiliary circuits 221 and 222 are shown in FIG. 3A. In the sensing circuit 230 shown in FIG. 3A, the data lines $DL_1$ and $DL_2$ are respectively connected with the corresponding auxiliary circuits 221 and 222. Each of the auxiliary circuits 221 and 222 comprises a pull-down device. For example, the pull-down device in the auxiliary circuit 221 is an n-type transistor $M_{PD1}$, and the pull-down device in the auxiliary circuit 222 is an n-type transistor $M_{PD2}$. For example, a first drain/source terminal of the n-type transistor $M_{PD1}$ is connected with the data line $DL_1$, a second drain/source terminal of the n-type transistor $M_{PD1}$ is connected with the ground terminal, and the gate terminal of the n-type transistor $M_{PD1}$ receives a reset signal $R_{ST}$.

The time interval between the time point $t_1$ and the time point to is the reset phase. In the reset phase, the reset signal $R_{ST}$ is switched from the low-level state to the high-level state, representing that the reset signal $R_{ST}$ is activated. Meanwhile, the n-type transistor $M_{PD1}$ and the n-type transistor $M_{PD2}$ are turned on. Consequently, the data lines $DL_1$ and $DL_2$ are discharged to the ground voltage. In other words, the ground voltage is the initial voltage.

After the reset phase, the time interval between the time point to and the time point $t_B$ is the charging phase. In the beginning of the charging phase, the charged voltages $V_{DL1}\sim V_{DL2}$ on the data lines $DL_1\sim DL_2$ start to rise from the initial voltage. The time interval between the time point $t_B$ and the time point $t_C$ is the sensing phase. In the charging phase and the sensing phase, the operations of the sense amplifiers 201 and 202 in the sensing circuit 230 are identical to those of FIGS. 2A and 2B, and not redundantly described herein.

FIG. 4A is a schematic circuit diagram illustrating a further exemplary sensing circuit used in the non-volatile memory of the present invention. FIG. 4B is a schematic timing waveform diagram illustrating associated signals of the sensing circuit as shown in FIG. 4A. In FIG. 4B, the time interval between the time point $t_1$ and the time point $t_D$ is a read cycle. In the read cycle, a read cycle signal $R_{CYCLE}$ is in the high-level state. Moreover, the read cycle contains a pre-charge state, a reset phase, a charging phase and a sensing phase.

In comparison with the sensing circuit 130 shown in FIG. 2A, the sensing circuit 260 of this embodiment further comprises p auxiliary circuits. For succinctness, only two auxiliary circuits 251 and 252 are shown in FIG. 4A. In the sensing circuit 260 shown in FIG. 4A, the data lines $DL_1$ and $DL_2$ are respectively connected with the corresponding auxiliary circuits 251 and 252. Each of the auxiliary circuits 251 and 252 comprises a pull-down device and a pull-up device.

For example, the pull-down device in the auxiliary circuit 251 is an n-type transistor $M_{PD1}$, and the pull-down device in the auxiliary circuit 252 is an n-type transistor $M_{PD2}$. Moreover, the pull-up device in the auxiliary circuit 251 is a p-type transistor $M_{PU1}$, and the pull-up device in the auxiliary circuit 252 is a p-type transistor $M_{PU2}$. Take the auxiliary circuit 251 for example. A first drain/source terminal of the n-type transistor $M_{PD1}$ is connected with the data line $DL_1$, a second drain/source terminal of the n-type transistor $M_{PD1}$ is connected with the ground terminal, and the gate terminal of the n-type transistor $M_{PD1}$ receives a reset signal $R_{ST}$. Moreover, a first drain/source terminal of the p-type transistor $M_{PU1}$ is connected with the data line $DL_1$, a second drain/source terminal of the p-type transistor $M_{PU1}$ receives a supply voltage $V_{DD}$, and the gate terminal of the p-type transistor $M_{PU1}$ receives a pre-charge signal $P_{RE}$.

The time interval between the time point $t_1$ and the time point $t_2$ is the pre-charge phase. In the pre-charge phase, the pre-charge signal $P_{RE}$ is switched from the high-level state to the low-level state, representing that the pre-charge signal $P_{RE}$ is activated. Meanwhile, the p-type transistor $M_{PU1}$ and the p-type transistor $M_{PU2}$ are turned on. Consequently, the data lines $DL_1$ and $DL_2$ are pre-charged to the supply voltage $V_{DD}$.

The time interval between the time point $t_2$ and the time point to is the reset phase. In the reset phase, the reset signal $R_{ST}$ is switched from the low-level state to the high-level state, representing that the reset signal $R_{ST}$ is activated. Meanwhile, the n-type transistor $M_{PD1}$ and the n-type transistor $M_{PD2}$ are turned on. Consequently, the data lines $DL_1$ and $DL_2$ are discharged to the ground voltage. In other words, the ground voltage is the initial voltage.

After the reset phase, the time interval between the time point to and the time point $t_B$ is the charging phase. In the beginning of the charging phase, the charged voltages $V_{DL1}$~$V_{DL2}$ on the data lines $DL_1$~$DL_2$ start to rise from the initial voltage. The time interval between the time point $t_B$ and the time point $t_C$ is the sensing phase. In the charging phase and the sensing phase, the operations of the sense amplifiers 201 and 202 in the sensing circuit 260 are identical to those of FIGS. 2A and 2B, and not redundantly described herein.

Figure 5A:
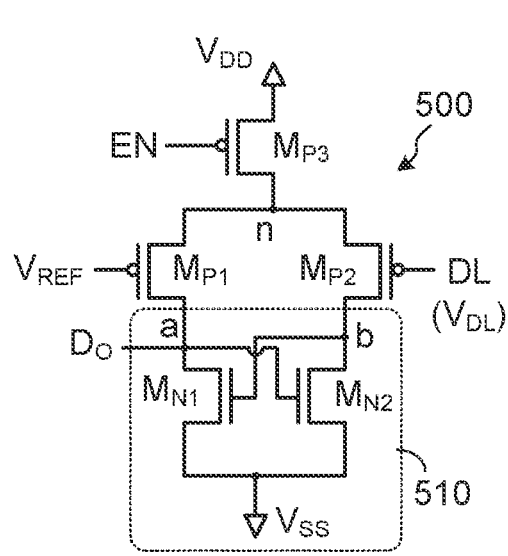
FIG. 5A is a schematic circuit diagram illustrating a sense amplifier according to a first embodiment of the present invention.

FIG. 5A is a schematic circuit diagram illustrating a sense amplifier according to a first embodiment of the present invention. The sense amplifier 500 is a latch type sense amplifier. As shown in FIG. 5A, the sense amplifier 500 comprises three transistors $M_{P1}$, $M_{P2}$, $M_{P3}$ and a latching device 510. The latching device 510 comprises two transistors $M_{N1}$ and $M_{N2}$. The transistors $M_{P1}$, $M_{P2}$ and $M_{P3}$ are p-type transistors. The transistors $M_{N1}$ and $M_{N2}$ are n-type transistors.

The first drain/source terminal of the transistor $M_{P3}$ receives the supply voltage $V_{DD}$. The gate terminal of the transistor $M_{P3}$ receives an enable signal EN. The second drain/source terminal of the transistor $M_{P3}$ is connected with a node n. The first drain/source terminal of the transistor $M_{P1}$ is connected with the node n. The gate terminal of the transistor $M_{P1}$ receives the reference voltage $V_{REF}$. The second drain/source terminal of the transistor $M_{P1}$ is connected with a node a. The first drain/source terminal of the transistor $M_{P2}$ is connected with the node n. The gate terminal of the transistor $M_{P2}$ is connected with the data line DL. The second drain/source terminal of the transistor $M_{P2}$ is connected with a node b. The latching device 510 is connected with the node a and node b. The gate terminal of the transistor $M_{P3}$ is an enable terminal of the sense amplifier 500. The gate terminal of the transistor $M_{P1}$ is a first input terminal of the sense amplifier 500. The gate terminal of the transistor $M_{P2}$ is a second input terminal of the sense amplifier 500.

The connecting relationship between the components of the latching device 510 will be described as follows. The first drain/source terminal of the transistor $M_{N1}$ is connected with the node a. The gate terminal of the transistor $M_{N1}$ is connected with the node b. The second drain/source terminal of the transistor $M_{N1}$ receives a supply voltage $V_{SS}$. The first drain/source terminal of the transistor $M_{N2}$ is connected with the node b. The gate terminal of the transistor $M_{N2}$ is connected with the node a. The second drain/source terminal of the transistor $M_{N2}$ receives the supply voltage $V_{SS}$. Moreover, the node a is an output terminal of the sense amplifier 500. An output signal $D_O$ is outputted from the node a. The magnitude of the supply voltage $V_{DD}$ is higher than the magnitude of the supply voltage $V_{SS}$. For example, the supply voltage $V_{DD}$ is 3.3.V, and the supply voltage $V_{SS}$ is a ground voltage (0V).

Generally, when the enable signal EN is in the high-level state, the transistor $M_{P3}$ is turned off. Meanwhile, the sense amplifier 500 is disabled. Moreover, when the enable signal EN is in the low-level state, the transistor $M_{P3}$ is turned on. Meanwhile, the sense amplifier 500 is enabled. Under this circumstance, the sense amplifier 500 generates the output signal $D_O$ according to the relationship between the charged voltage $V_{DL}$ on the data line DL and the reference voltage $V_{REF}$.

For example, if the charged voltage $V_{DL}$ on the data line DL is lower than the reference voltage $V_{REF}$, the transistor $M_{P2}$ is turned on, the transistor $M_{P1}$ is turned off, the transistor $M_{N1}$ is turned on, and the transistor $M_{N2}$ is turned off. Consequently, the output signal $D_O$ is the supply voltage $V_{SS}$, indicating that the output signal $D_O$ has a first voltage level (e.g., a low voltage level). Whereas, if the charged voltage $V_{DL}$ on the data line DL is higher than the reference voltage $V_{REF}$, the transistor $M_{P2}$ is turned off, the transistor $M_{P1}$ is turned on, the transistor $M_{N1}$ is turned off, and the transistor $M_{N2}$ is turned on. Consequently, the output signal $D_O$ is the supply voltage $V_{DD}$, indicating that the output signal $D_O$ has a second voltage level (e.g., a high voltage level).

As mentioned above, the sense amplifier 500 of the first embodiment can be applied to the sensing circuit 130. That is, p sense amplifiers 500 are respectively connected with the p data lines $DL_1$~$DL_p$. In the sensing phase of the read cycle, the p output signals $D_{O1}$~$D_{Op}$ are respectively generated according to the relationships between the reference voltage $V_{REF}$ and the charged voltages $V_{DL1}$~$V_{DLp}$ on the data lines $DL_1$~$DL_p$. The p output signals $D_{O1}$~$D_{Op}$ can be used to indicate the storing states of the p selected memory cells in the selected row.

Figure 5B:
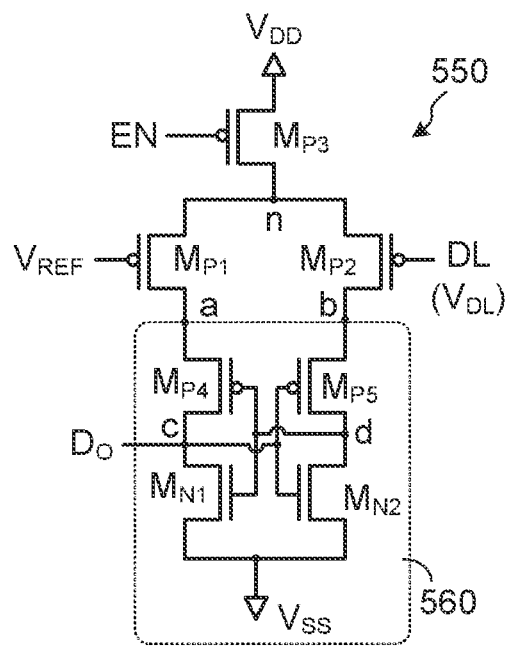
FIG. 5B is a schematic circuit diagram illustrating a sense amplifier according to a second embodiment of the present invention.

FIG. 5B is a schematic circuit diagram illustrating a sense amplifier according to a second embodiment of the present invention. The sense amplifier 550 is a latch type sense amplifier. In comparison with the sense amplifier 500 of the first embodiment, the structure of the latching device 560 in the sense amplifier 500 of this embodiment is distinguished. For succinctness, only the relationship between the latching device 560 and associated components will be described as follows.

The latching device 560 comprises four transistors $M_{P4}$, $M_{P5}$, $M_{N1}$ and $M_{N2}$. The transistors $M_{P4}$ and $M_{P5}$ are p-type transistors, and the transistors $M_{N1}$ and $M_{N2}$ are n-type transistors. The connecting relationship between the components of the latching device 560 will be described as follows. The first drain/source terminal of the transistor $M_{P4}$ is connected with the node a. The gate terminal of the transistor $M_{P4}$ is connected with a node d. The second drain/source terminal of the transistor $M_{P4}$ is connected with a node c. The first drain/source terminal of the transistor $M_{P5}$ is connected with the node b. The gate terminal of the transistor $M_{P5}$ is connected with a node c. The second drain/source terminal of the transistor $M_{P5}$ is connected with the node d. The first drain/source terminal of the transistor $M_{N1}$ is connected with the node c. The gate terminal of the transistor terminal $M_{N1}$ is connected with the node d. The second drain/source terminal of the transistor $M_{N1}$ receives the supply source $V_{SS}$. The first drain/source terminal of the transistor $M_{N2}$ is connected with the node d. The gate terminal of the transistor $M_{N2}$ is connected with the node c. The second drain/source terminal of the transistor $M_{N2}$ receives the supply voltage $V_{SS}$. The node c is an output terminal of the sense amplifier 550. In addition, the output signal $D_O$ is outputted from the node c. Moreover, the magnitude of the supply voltage $V_{DD}$ is higher than the magnitude of the supply voltage $V_{SS}$. For example, the supply voltage $V_{DD}$ is 3.3.V, and the supply voltage $V_{SS}$ is 0V.

Similarly, when the enable signal EN is in the high-level state, the transistor $M_{P3}$ is turned off. Meanwhile, the sense amplifier 550 is disabled. Moreover, when the enable signal EN is in the low-level state, the transistor $M_{P3}$ is turned on. Meanwhile, the sense amplifier 550 is enabled. Under this circumstance, the sense amplifier 550 generates the output signal $D_O$ according to the relationship between the charged voltage $V_{DL}$ on the data line DL and the reference voltage $V_{REF}$.

For example, if the charged voltage $V_{DL}$ on the data line DL is lower than the reference voltage $V_{REF}$, the transistor $M_{P2}$ is turned on, the transistor $M_{P5}$ is turned on, the transistor $M_{P1}$ is turned off, the transistor $M_{P4}$ is turned off, the transistor $M_{N1}$ is turned on, and the transistor $M_{N2}$ is turned off. Consequently, the output signal $D_O$ is the supply voltage $V_{SS}$, indicating that the output signal $D_O$ has a first voltage level (e.g., a low voltage level). Whereas, if the charged voltage $V_{DL}$ on the data line DL is higher than the reference voltage $V_{REF}$, the transistor $M_{P2}$ is turned off, the transistor $M_{P5}$ is turned off, the transistor $M_{P1}$ is turned on, the transistor $M_{P4}$ is turned on, the transistor $M_{N1}$ is turned off, and the transistor $M_{N2}$ is turned on. Consequently, the output signal $D_O$ is the supply voltage $V_{DD}$, indicating that the output signal $D_O$ has a second voltage level (e.g., a high voltage level).

As mentioned above, the sense amplifier 550 of the second embodiment can be applied to the sensing circuit 130. That is, p sense amplifiers 550 are respectively connected with the p data lines $DL_1$~$DL_p$. In the sensing phase of the read cycle, the p output signals $D_{O1}$~$D_{Op}$ are respectively generated according to the relationships between the reference voltage $V_{REF}$ and the charged voltages $V_{DL1}$~$V_{DLp}$ on the data lines $DL_1$~$DL_p$. The p output signals $D_{O1}$-$D_{Op}$ can be used to indicate the storing states of the p selected memory cells in the selected row.

In the two sense amplifiers 500 and 550, the first voltage level of the output signal $D_O$ is the low voltage level, and the second voltage level of the output signal $D_O$ is the high voltage level. It is noted that numerous modifications and alterations may be made while retaining the teachings of the invention. For example, in a variant example, the node b of the sense amplifier 500 is the output terminal. Under this circumstance, the first level state of the output signal $D_O$ is the high voltage level, and the second level state of the output signal $D_O$ is the low voltage level. That is, the node b can be served as the output terminal of the sense amplifier 500. Similarly, in a variant example, the node d of the sense amplifier 550 is the output terminal. Under this circumstance, the first level state of the output signal $D_O$ is the high voltage level, and the second level state of the output signal $D_O$ is the low voltage level. That is, the node d can be served as the output terminal of the sense amplifier 550.

Alternatively, the node a and the node b are used as two output terminals of the sense amplifier 500. Moreover, the node a and the node b generate complementary output signals. Similarly, the node c and the node d are used as two output terminals of the sense amplifier 550. Moreover, the node c and the node d generate complementary output signals.

Figure 6A:
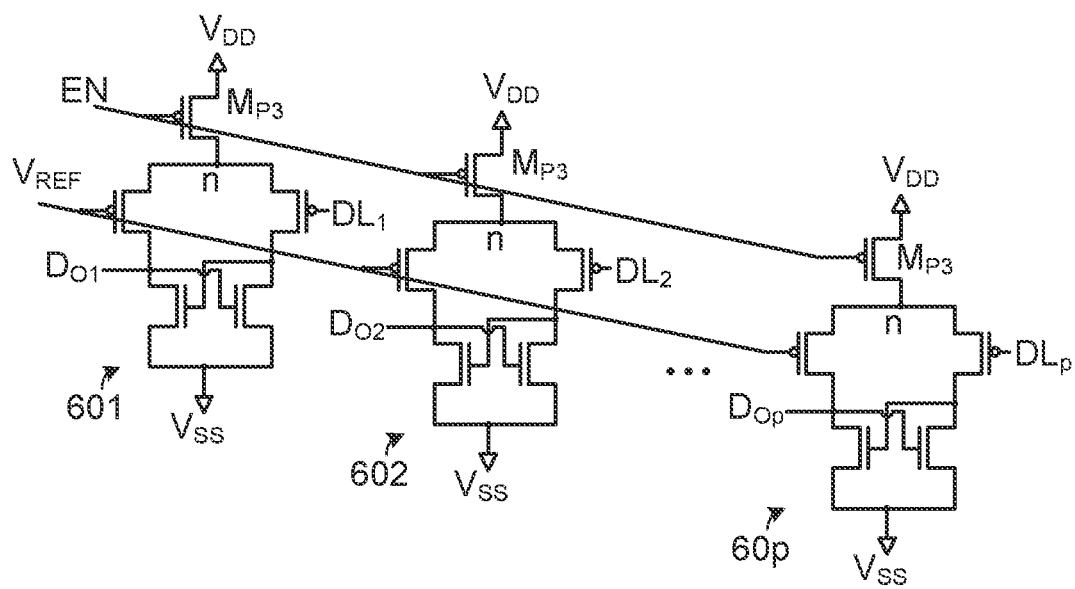
FIG. 6A is a schematic circuit diagram illustrating a sensing circuit with sense amplifiers of the first embodiment.
Figure 6B:
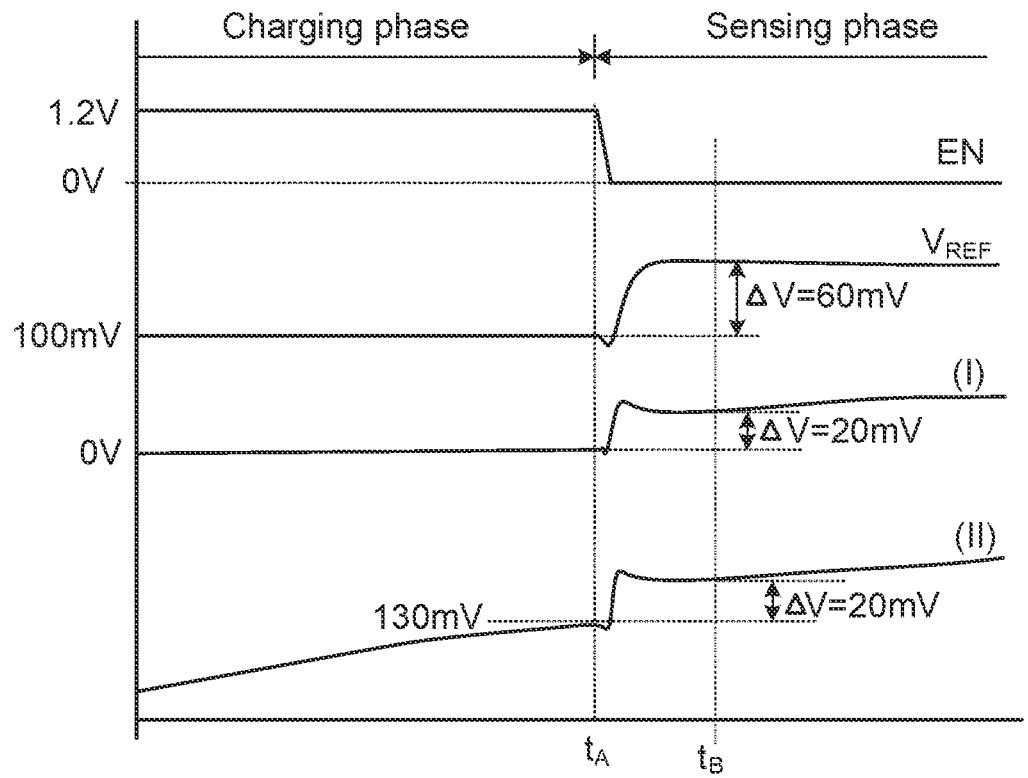
FIG. 6B is a schematic timing waveform diagram illustrating associated signals of the sensing circuit as shown in FIG. 6A.

FIG. 6A is a schematic circuit diagram illustrating a sensing circuit with sense amplifiers of the first embodiment. FIG. 6B is a schematic timing waveform diagram illustrating associated signals of the sensing circuit as shown in FIG. 6A. As shown in FIG. 6A, the sensing circuit comprises p sense amplifiers 601~60p. The circuitry structure of each of the p sense amplifiers 601~60p is identical to the circuitry structure of the sense amplifier of the first embodiment.

The first input terminals of the p sense amplifiers 601~60p receive a reference voltage $V_{REF}$. The second input terminals of the p sense amplifiers 601~60p are respectively connected with the corresponding p data lines $DL_1$~$DL_p$. The enable terminals of the p sense amplifiers 601~60p receives an enable signal EN. The output terminals of the sense amplifiers 601~60p respectively generate output signals $D_{O1}$~$D_{Op}$.

As shown in FIG. 6A, the first input terminals of the p sense amplifiers 601~60p receive the reference voltage $V_{REF}$. Consequently, the reference voltage $V_{REF}$ is a global signal. Moreover, since the second input terminals of the p sense amplifiers 601~60p are respectively connected with the corresponding p data lines $DL_1$~$DL_p$, the signals on the data lines $DL_1$~$DL_p$ are local signals.

Please refer to FIG. 6B. At the time point $t_A$, the enable signal EN is switched from the high-level state to the low-level state, indicating that the charging phase is changed to the sensing phase. Meanwhile, the transistors $M_{P3}$ in the sense amplifiers 601~60p are turned on. Consequently, the voltage at the node n quickly rises to the supply voltage $V_{DD}$. Since the voltage at the node n rises quickly, a capacitive coupling effect is generated. Due to the capacitive coupling effect, the rising voltage at the node n is coupled to the data lines $DL_1$~$DL_p$ and the reference voltage $V_{REF}$. Consequently, the data lines $DL_1$~$DL_p$ and the reference voltage $V_{REF}$ are suffered from signal disturbance. The signal disturbance may result in misjudgment of the sense amplifiers 601~60p. The reason will be described as follows.

Please refer to FIG. 6B again. At the time point $t_A$, the charging phase is changed to the sensing phase. Since the reference voltage $V_{REF}$ is the global signal, the capacitive coupling effect becomes stronger. Under this circumstance, a larger couple voltage of positive polarity is generated. At the time point $t_B$, the couple voltage ($\Delta V$) of positive polarity is approximately 60 mV. In other words, the reference voltage $V_{REF}$ rises from 100 mV to about 160 mV.

Moreover, the changes of the voltages on the data lines $DL_1$~$DL_p$ may be classified into two situations. In the first situation, the selected memory cell is in the first storing state, and the generated cell current is very low (i.e., nearly zero). In the second situation, selected memory cell is in the second storing state, and the generated cell current is relatively higher.

Please refer to the curve (I) as shown in FIG. 6B. If the cell current received by the data line is very low (i.e., nearly zero), the charged voltage on the data line rises at a slower rate. At the time point $t_A$ when the changing phase is switched to the sensing phase, the charged voltage is nearly zero. Moreover, since the signal on the data line DL is a local signal, the capacitive coupling effect is weaker. Under this circumstance, a smaller couple voltage of positive polarity is generated. At the time point $t_B$, the couple voltage (ΔV) of positive polarity is approximately 20 mV. In other words, the charged voltage on the data line rises from 0 mV to about 20 mV. In the sensing phase, the reference voltage $V_{REF}$ is about 160 mV, and the charged voltage on the data line DL is about 20 mV. In other words, the reference voltage $V_{REF}$ is higher than the charged voltage on the data line DL. Consequently, the output signal from the sense amplifier has the first voltage level, indicating that the selected memory cell is in the first storing state.

Please refer to the curve (II) as shown in FIG. 6B. If the cell current received by the data line is relatively higher, the charged voltage on the data line rises continuously. At the time point to when the changing phase is switched to the sensing phase, the charged voltage is about 130 mV. At the time point $t_B$, the couple voltage (ΔV) of positive polarity is approximately 20 mV. In other words, the charged voltage on the data line DL rises from 130 mV to about 150 mV. In the sensing phase, the reference voltage $V_{REF}$ is about 160 mV, and the charged voltage on the data line is about 150 mV. In other words, the reference voltage $V_{REF}$ is higher than the charged voltage on the data line DL. Consequently, the output signal from the sense amplifier has the first voltage level, indicating that the selected memory cell is in the first storing state. Actually, the selected memory cell should be in the second storing state. However, the sense amplifier misjudges that the selected memory cell is in the first storing state.

As mentioned above, at the moment when the operating phase of the sense amplifier is switched from the charging phase to the sensing phase, the voltage at the node n rises quickly, and thus the capacitive coupling effect is generated. Moreover, since the voltage at the node n rises, two couple voltages are generated and respectively coupled to the two input terminals of the sense amplifier. For example, the first couple voltage is coupled to the reference voltage $V_{REF}$, and the second couple voltage is coupled to the data line DL. Since the reference voltage $V_{REF}$ and the charged voltage on the data line increase, the misjudgment of the sense amplifier occurs. Similarly, the sensing circuit with the sense amplifiers 550 of the second embodiment also the above problems. When the charging phase is switched to the sensing phase, the signal disturbance occurs. The signal disturbance may result in misjudgment of the sense amplifier.

In order to overcome the above drawbacks, the circuitry structure of the sense amplifier needs to be modified. For example, in another embodiment, the sense amplifier is additionally equipped with two anti-couple devices for compensating the signal disturbance at the two input terminals of the sense amplifier. For example, the anti-couple devices are capacitors.

Figure 7A:
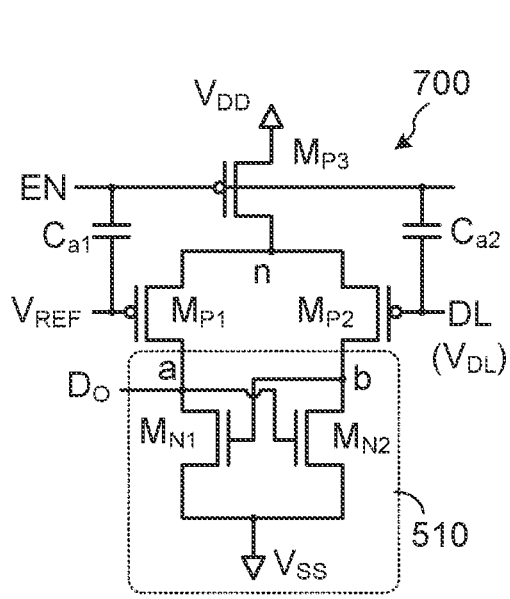
FIG. 7A is a schematic circuit diagram illustrating a sense amplifier according to a third embodiment of the present invention.

FIG. 7A is a schematic circuit diagram illustrating a sense amplifier according to a third embodiment of the present invention. The sense amplifier 700 is a latch type sense amplifier. The sense amplifier 700 comprises three transistors $M_{P1}$, $M_{P2}$, $M_{P3}$, a latching device 510 and two capacitors $C_{a1}$, $C_{a2}$.

In comparison with the sense amplifier 500 of the first embodiment, the sense amplifier 700 of this embodiment further comprises the two capacitors $C_{a1}$ and $C_{a2}$. The first terminal of the capacitor $C_{a1}$ is connected with the gate terminal of the transistor $M_{P3}$. The second terminal of the capacitor $C_{a1}$ is connected with the gate terminal of the transistor $M_{P1}$. The first terminal of the capacitor $C_{a2}$ is connected with the gate terminal of the transistor $M_{P3}$. The second terminal of the capacitor $C_{a2}$ is connected with the gate terminal of the transistor $M_{P2}$.

Figure 7B:
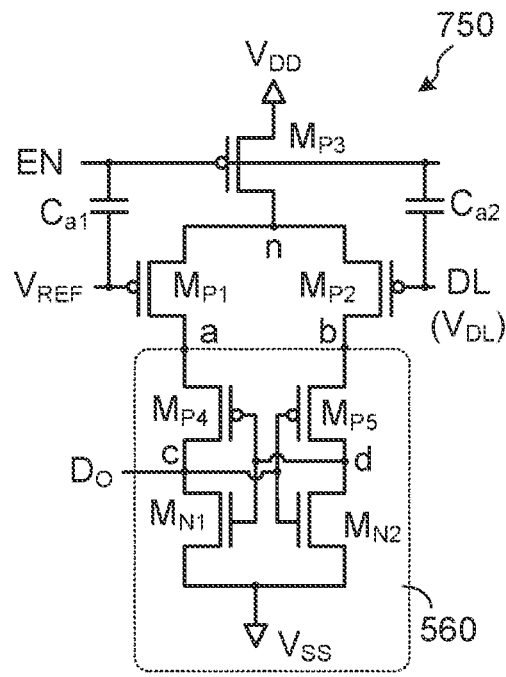
FIG. 7B is a schematic circuit diagram illustrating a sense amplifier according to a fourth embodiment of the present invention.

FIG. 7B is a schematic circuit diagram illustrating a sense amplifier according to a fourth embodiment of the present invention. The sense amplifier 750 is a latch type sense amplifier. The sense amplifier 750 comprises three transistors $M_{P1}$, $M_{P2}$, $M_{P3}$, a latching device 560 and two capacitors $C_{a1}$, $C_{a2}$.

In comparison with the sense amplifier 550 of the second embodiment, the sense amplifier 750 further comprises the two capacitors $C_{a1}$ and $C_{a2}$. The first terminal of the capacitor $C_{a1}$ is connected with the gate terminal of the transistor $M_{P3}$. The second terminal of the capacitor $C_{a1}$ is connected with the gate terminal of the transistor $M_{P1}$. The first terminal of the capacitor $C_{a2}$ is connected with the gate terminal of the transistor $M_{P3}$. The second terminal of the capacitor $C_{a2}$ is connected with the gate terminal of the transistor $M_{P2}$.

The operations of the sense amplifier 700 of the third embodiment are similar to the operations of the sense amplifier 500 of the first embodiment. The operations of the sense amplifier 750 of the fourth embodiment are similar to the operations of the sense amplifier 550 of the second embodiment. It is noted that numerous modifications and alterations may be made while retaining the teachings of the invention. For example, in a variant example, the node b of the sense amplifier 700 is the output terminal. In another variant example, the node a and the node b are used as two output terminals of the sense amplifier 700 for generating complementary output signals. Similarly, in a variant example, the node b of the sense amplifier 750 is the output terminal. In another variant example, the node c and the node d are used as two output terminals of the sense amplifier 750 for generating complementary output signals.

In the third and fourth embodiments, the anti-couple devices receive the enable signal EN. Moreover, the enable signal EN is activated when the enable signal EN is switched from the high-level state to the low-level state. Consequently, the two input terminals of the sense amplifier generate a couple voltage of negative polarity to compensate the couple voltage of positive polarity. In other words, the signal disturbance at the two input terminals of the sense amplifiers 700 and 750 will be reduced. Consequently, the probability of causing misjudgment of the sense amplifiers 700 and 750 will be reduced.

Take the sense amplifier 700 of the third embodiment for example. When the enable single EN of the sense amplifier 700 is activated, the transistor $M_{P3}$ is turned on. Consequently, the voltage at the node n changes quickly (i.e., rises quickly), and the capacitive coupling effect is generated. Since the voltage at the node n rises, two couple voltages of positive polarity are generated. The two couple voltages of positive polarity are respectively coupled to the two input terminals of the sense amplifier. When the enable signal EN is switched from the high-level state to the low-level state, the enable signal EN is activated. Consequently, two couple voltages of negative polarity are generated and respectively coupled to the two input terminals of the sense amplifier through the two capacitors $C_{a1}$ and $C_{a2}$. The couple voltages of the positive polarity and the corresponding couple voltages of negative polarity are offset by each other. Consequently, the signal disturbance at the two input terminals of the sense amplifiers 700 will be reduced.

For example, since the voltage at the node n rises, first and second couple voltages of positive polarity are generated. The first couple voltage of positive polarity is coupled to the first input terminal of the sense amplifier 700. The second couple voltage of positive polarity is coupled to the second input terminal of the sense amplifier 700. Similarly, when the enable signal EN is switched from the high-level state to the low-level state, the enable signal EN is activated. Consequently, third and fourth couple voltages of negative polarity are generated. The third couple voltage is coupled to the first input terminal of the sense amplifier 700. The fourth couple voltage is coupled to the second input terminal of the sense amplifier 700. Since the first couple voltage and the third couple voltage are offset by each other, the signal disturbance at the first input terminal of the sense amplifiers 700 is reduced. Moreover, since the second couple voltage and the fourth couple voltage are offset by each other, the signal disturbance at the second input terminal of the sense amplifier 700 is reduced.

Figure 8A:
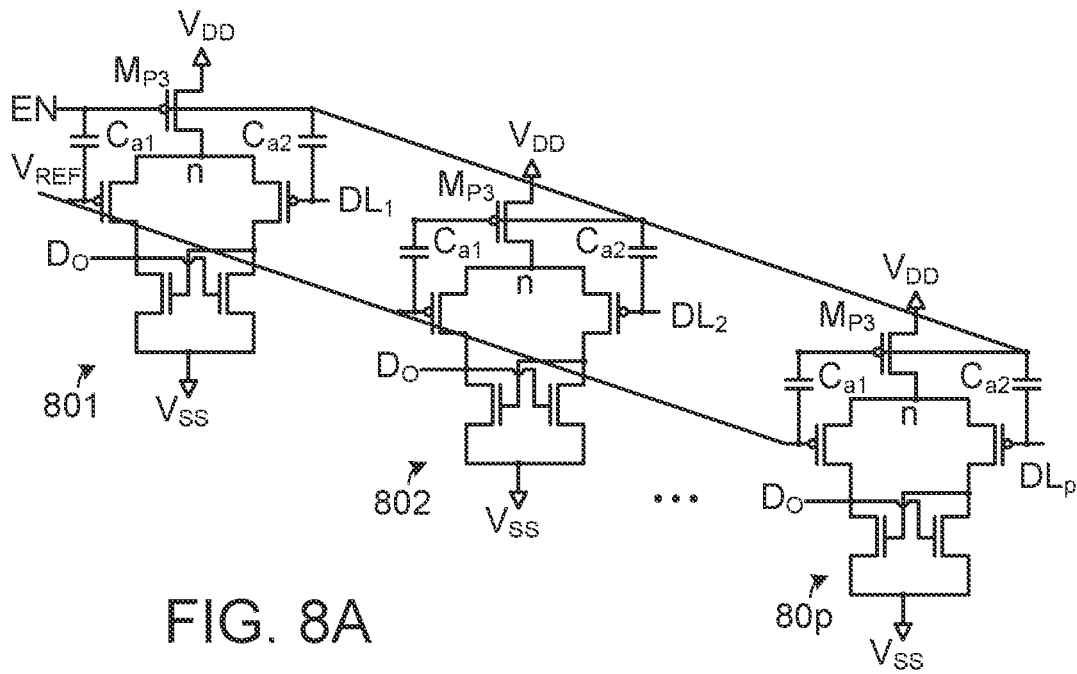
FIG. 8A is a schematic circuit diagram illustrating a sensing circuit with sense amplifiers of the third embodiment.
Figure 8B:
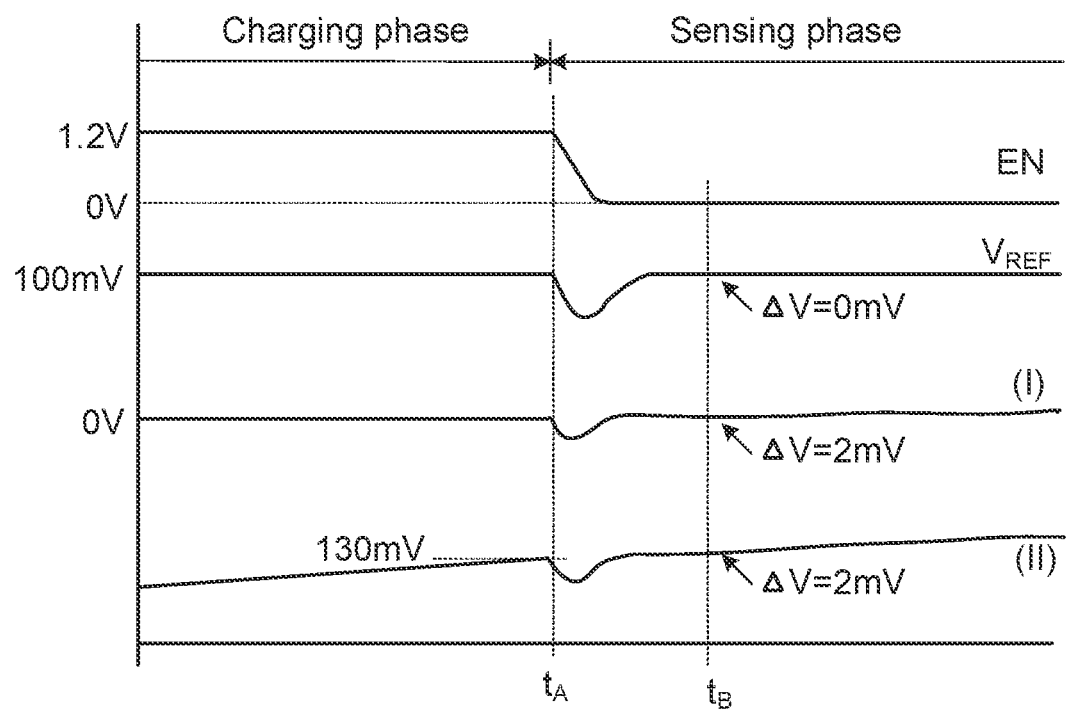
FIG. 8B is a schematic timing waveform diagram illustrating associated signals of the sensing circuit as shown in FIG. 8A.

FIG. 8A is a schematic circuit diagram illustrating a sensing circuit with sense amplifiers of the third embodiment. FIG. 8B is a schematic timing waveform diagram illustrating associated signals of the sensing circuit as shown in FIG. 8A. As shown in FIG. 8A, the sensing circuit comprises p sense amplifiers 801~80p. The circuitry structure of each of the p sense amplifiers 801~80p is identical to the circuitry structure of the sense amplifier of the third embodiment.

The first input terminals of the p sense amplifiers 801~80p receive a reference voltage $V_{REF}$. The second input terminals of the p sense amplifiers 801~80p are respectively connected with the corresponding p data lines DL1-DL p. The enable terminals of the p sense amplifiers 801~80p receive an enable signal EN. The output terminals of the sense amplifiers 801~80p respectively generate output signals $D_{O1}$~$D_{Op}$.

Please refer to FIG. 8B. At the time point $t_A$, the charging phase is changed to the sensing phase. Each of the p sense amplifiers 801~80p comprises the capacitors $C_{a1}$ and $C_{a2}$. Due to the arrangement of the capacitors $C_{a1}$ and $C_{a2}$, the signal disturbance at the two input terminals of each of the sense amplifiers 801~80p will be reduced. Consequently, at the time point $t_A$, the offset couple voltage ($\Delta V$) is approximately equal to 0 mV. In other words, the reference voltage $V_{REF}$ nearly doesn't drop and maintains at nearly 100 mV.

Moreover, the changes of the voltages on the data lines $DL_1$~$DL_p$ may be classified into two situations. In the first situation, the selected memory cell is in the first storing state, and the generated cell current is very low (i.e., nearly zero). In the second situation, selected memory cell is in the second storing state, and the generated cell current is relatively higher.

Please refer to the curve (I) as shown in FIG. 8B. If the cell current received by the data line is very low (i.e., nearly zero), the charged voltage on the data line rises at a slower rate. At the time point $t_A$ when the changing phase is switched to the sensing phase, the charged voltage is nearly zero. At the time point $t_B$, the offset couple voltage ($\Delta V$) is approximately 2 mV. In other words, the charged voltage on the data line rises from 0 mV to about 2 mV. In the sensing phase, the reference voltage $V_{REF}$ is about 100 mV, and the charged voltage on the data line is about 2 mV. In other words, the reference voltage $V_{REF}$ is higher than the charged voltage on the data line. Consequently, the output signal from the sense amplifier has the first voltage level, indicating that the selected memory cell is in the first storing state.

Please refer to the curve (II) as shown in FIG. 8B. If the cell current received by the data line is relatively higher, the charged voltage on the data line rises continuously. At the time point $t_A$ when the changing phase is switched to the sensing phase, the charged voltage is about 130 mV. At the time point $t_B$, the offset couple voltage ($\Delta V$) is approximately 2 mV. In other words, the charged voltage on the data line rises from 130 mV to about 132 mV. In the sensing phase, the reference voltage $V_{REF}$ is about 100 mV, and the charged voltage on the data line is about 132 mV. In other words, the reference voltage $V_{REF}$ is lower than the charged voltage on the data line. Consequently, the output signal from the sense amplifier has the second voltage level, indicating that the selected memory cell is in the second storing state. Obviously, the sense amplifier judges correctly that the selected memory cell is in the second storing state.

Likewise, the sensing circuit with the sense amplifiers 750 of the fourth embodiment can largely reduce the probability of causing misjudgment. Moreover, in the sensing circuit of FIG. 8A, p capacitors $C_{a1}$ are connected between the enable terminals and the first input terminals of the p sense amplifiers 801~80p in parallel. It is noted that numerous modifications and alterations may be made while retaining the teachings of the invention. For example, the number of capacitors connected between the enable terminals and the first input terminals of the p sense amplifiers 801~80p in parallel is not restricted. In a variant example, a single capacitor is connected between the enable terminals and the first input terminals of the p sense amplifiers 801~80p. In this case, the capacitance of the single capacitor is equal to the total of the capacitances of the p capacitors $C_{a1}$.

In the above embodiments, the anti-couple devices are the capacitors $C_{a1}$ and $C_{a2}$. For example, the capacitors $C_{a1}$ and $C_{a2}$ are plate capacitors. Alternatively, the capacitors $C_{a1}$ and $C_{a2}$ are defined by n-type transistors or the p-type transistors. FIGS. 9A and 9B schematically illustrate two other possible examples of the anti-couple devices used in the sense amplifier of the present invention.

As shown in FIG. 9A, the anti-couple device comprises an n-type transistor $M_{NC}$. The n-type transistor $M_{NC}$ is connected to be formed as a MOS capacitor. The gate terminal of the n-type transistor $M_{NC}$ is the first terminal of the MOS capacitor. The two drain/source terminals of the n-type transistor $M_{NC}$ are connected with each other and served as the second terminal of the MOS capacitor. In a variant example, the gate terminal of the n-type transistor $M_{NC}$ is the second terminal of the MOS capacitor, and the two drain/source terminals of the n-type transistor $M_{NC}$ are connected with each other and served as the first terminal of the MOS capacitor.

As shown in FIG. 9B, the anti-couple device comprises a p-type transistor $M_{PC}$. The p-type transistor $M_{PC}$ is connected to be formed as a MOS capacitor.

The gate terminal of the p-type transistor $M_{PC}$ is the first terminal of the MOS capacitor. The two drain/source terminals of the p-type transistor $M_{PC}$ are connected with each other and served as the second terminal of the MOS capacitor. In a variant example, the gate terminal of the p-type transistor $M_{PC}$ is the second terminal of the MOS capacitor, and the two drain/source terminals are connected with each other and served as the first terminal of the MOS capacitor.

By adjusting the size of the p-type transistor $M_{PC}$ or the n-type transistor $M_{NC}$, the capacitance of the MOS capacitor is correspondingly adjusted. Consequently, the voltage coupling ratio is adjusted. In this way, the signal disturbance at the two input terminals of the sense amplifier will be reduced.

In the above embodiments, the enable signal EN is activated when the enable signal EN is switched from the high-level state to the low-level state. It is noted that numerous modifications and alterations may be made while retaining the teachings of the invention. For example, in another embodiment, the enable signal EN is activated when the enable signal EN is switched from the low-level state to the high-level state. According to characteristics of the enable signal EN, some other embodiments of the sense amplifier can be designed.

FIG. 10A is a schematic circuit diagram illustrating a sense amplifier according to a fifth embodiment of the present invention. The sense amplifier 900 is a latch type sense amplifier.

The sense amplifier 900 comprises three transistors $M_{N1}$, $M_{N2}$, $M_{N3}$, two capacitors $C_{b1}$, $C_{b2}$ and a latching device 910. The latching device 910 comprises two transistors $M_{P1}$ and $M_{P2}$. The transistors $M_{N1}$, $M_{N2}$, $M_{N3}$ are n-type transistors, and the transistors $M_{P1}$, $M_{P2}$ are p-type transistors.

The first drain/source terminal of the first transistor $M_{N3}$ receives a supply voltage $V_{SS}$. The gate terminal of the transistor $M_{N3}$ receives an enable signal EN. The second drain/source terminal of the transistor $M_{N3}$ is connected with a node m. The first drain/source terminal of the transistor $M_{N1}$ is connected with the node m. The gate terminal of the transistor $M_{N1}$ receives the reference voltage $V_{REF}$. The second drain/source terminal of the transistor $M_{N1}$ is connected with a node a. The first drain/source terminal of the transistor $M_{N2}$ is connected with the node m. The gate terminal of the transistor $M_{N2}$ is connected with a data line DL. The second drain/source terminal of the transistor $M_{N2}$ is connected with a node b. The latching device 910 is connected with the node a and the node b. The gate terminal of the transistor $M_{N3}$ is an enable terminal of the sense amplifier 900. The gate terminal of the transistor $M_{N1}$ is the first input terminal of the sense amplifier 900. The gate terminal of the transistor $M_{N2}$ is the second input terminal of the sense amplifier 900.

The first terminal of the capacitor $C_{b1}$ is connected with the gate terminal of the transistor $M_{N3}$. The second terminal of the capacitor $C_{b1}$ is connected with the gate terminal of the transistor $M_{N1}$. The first terminal of the capacitor $C_{b2}$ is connected with the gate terminal of the transistor $M_{N3}$. The second terminal of the capacitor $C_{b2}$ is connected with the gate terminal of the transistor $M_{N2}$.

In the latching device 910, the first drain/source terminal of the transistor $M_{P1}$ is connected with the node a. The gate terminal of the transistor $M_{P1}$ is connected with the node b. The second drain/source terminal of the transistor $M_{P1}$ receives a supply voltage $V_{DD}$. The first drain/source terminal of the transistor $M_{P2}$ is connected with the node b. The gate terminal of the transistor $M_{P2}$ is connected with the node a. The second drain/source terminal of the transistor $M_{P2}$ receives the supply voltage $V_{DD}$. The node a is the output terminal of the sense amplifier 900 to generate the output signal $D_O$. The supply voltage $V_{DD}$ is higher than the supply voltage $V_{SS}$. For example, the supply voltage $V_{DD}$ is 3.3V, and the supply voltage $V_{SS}$ is a ground voltage (0V).

Generally, when the enable signal EN is in the low-level state, the transistor $M_{N3}$ is turned off. Meanwhile, the sense amplifier 900 is disabled. Moreover, when the enable signal EN is in the high-level state, the transistor $M_{N3}$ is turned on. Meanwhile, the sense amplifier 900 is enabled. Under this circumstance, the sense amplifier 900 generates the output signal $D_O$ according to the relationship between the charged voltage $V_{DL}$ on the data line DL and the reference voltage $V_{REF}$.

For example, if the charged voltage $V_{DL}$ on the data line DL is lower than the reference voltage $V_{REF}$, the transistor $M_{N2}$ is turned off, the transistor $M_{N1}$ is turned on, the transistor $M_{P1}$ is turned off, and the transistor $M_{P2}$ is turned on. Consequently, the output signal $D_O$ is the supply voltage $V_{SS}$, indicating that the output signal $D_O$ has a first voltage level (e.g., a low voltage level). Whereas, if the charged voltage $V_{DL}$ on the data line DL is higher than the reference voltage $V_{REF}$, the transistor $M_{N2}$ is turned on, the transistor $M_{N1}$ is turned off, the transistor $M_{P1}$ is turned on, and the transistor $M_{P2}$ is turned off. Consequently, the output signal $D_O$ is the supply voltage $V_{DD}$, indicating that the output signal $D_O$ has a second voltage level (e.g., a high voltage level).

As mentioned above, the sense amplifier 900 of the fifth embodiment can be applied to the sensing circuit. That is, p sense amplifiers 900 are respectively connected with the p data lines $DL_1 \sim DL_p$. In the sensing phase of the read cycle, the p output signals $D_{O1} \sim D_{Op}$ are respectively generated according to the relationships between the reference voltage $V_{REF}$ and the charged voltages $V_{DL1} \sim V_{DLp}$ on the data lines $DL_1 \sim DL_p$. The p output signals $D_{O1} \sim D_{Op}$ can be used to indicate the storing states of the p selected memory cells in the selected row.

FIG. 10B is a schematic circuit diagram illustrating a sense amplifier according to a sixth embodiment of the present invention. The sense amplifier 950 is a latch type sense amplifier. In comparison with the sense amplifier 900 of the fifth embodiment, the structure of the latching device 960 in the sense amplifier 950 of this embodiment is distinguished. For succinctness, only the relationship between the latching device 960 and associated components will be described as follows.

The latching device 960 comprises four transistors $M_{N4}$, $M_{N5}$, $M_{P1}$ and $M_{P2}$. The transistors $M_{N4}$ and $M_{N5}$ are n-type transistors, and the transistors $M_{P1}$ and $M_{P2}$ are p-type transistors. In the latching device 960, the first drain/source terminal of the transistor $M_{N4}$ is connected with the node a. The gate terminal of the transistor $M_{N4}$ is connected with a node d. The second drain/source terminal of the transistor $M_{N4}$ is connected with a node c. The first drain/source terminal of the transistor $M_{N5}$ is connected with the node b. The gate terminal of the transistor $M_{N5}$ is connected with the node c. The second drain/source terminal of the transistor $M_{N5}$ is connected with the node d. The first drain/source terminal of the transistor $M_{P1}$ is connected with the node c. The gate terminal of the transistor $M_{P1}$ is connected with the node d. The second drain/source terminal of the transistor $M_{P1}$ receives the supply voltage $V_{DD}$. The first drain/source terminal of the transistor $M_{P2}$ is connected with the node d. The gate terminal of the transistor $M_{P2}$ is connected with the node c. The second drain/source terminal of the transistor $M_{P2}$ receives the supply voltage $V_{DD}$. The node c is an output terminal of the sense amplifier 950 to generate the output signal $D_O$. Moreover, the magnitude of the supply voltage $V_{DD}$ is higher than the magnitude of the supply voltage $V_{SS}$. For example, the supply voltage $V_{DD}$ is 3.3.V, and the supply voltage $V_{SS}$ is 0V.

Similarly, when the enable signal EN is in the low-level state, the transistor $M_{N3}$ is turned off. Meanwhile, the sense amplifier 950 is disabled. Moreover, when the enable signal EN is in the high-level state, the transistor $M_{N3}$ is turned on. Meanwhile, the sense amplifier 950 is enabled. Under this circumstance, the sense amplifier 950 generates the output signal $D_O$ according to the relationship between the charged voltage $V_{DL}$ on the data line DL and the reference voltage $V_{REF}$.

For example, if the charged voltage $V_{DL}$ on the data line DL is lower than the reference voltage $V_{REF}$, the transistor $M_{N2}$ is turned off, the transistor $M_{N5}$ is turned off, the transistor $M_{N1}$ is turned on, the transistor $M_{N4}$ is turned on, the transistor $M_{P1}$ is turned off, and the transistor $M_{P2}$ is turned on. Consequently, the output signal $D_O$ is the supply voltage $V_{SS}$, indicating that the output signal $D_O$ has a first voltage level (e.g., a low voltage level). Whereas, if the charged voltage $V_{DL}$ on the data line DL is higher than the reference voltage $V_{REF}$, the transistor $M_{N2}$ is turned on, the transistor $M_{N5}$ is turned on, the transistor $M_{N1}$ is turned off, the transistor $M_{N4}$ is turned off, the transistor $M_{P1}$ is turned on, and the transistor $M_{P2}$ is turned off. Consequently, the output signal $D_O$ is the supply voltage $V_{DD}$, indicating that the output signal $D_O$ has a second voltage level (e.g., a high voltage level).

As mentioned above, the sense amplifier 950 of the sixth embodiment can be applied to the sensing circuit. That is, p sense amplifiers 950 are respectively connected with the p data lines $DL_1 \sim DL_p$. In the sensing phase of the read cycle, the p output signals $D_{O1} \sim D_{Op}$ are respectively generated according to the relationships between the reference voltage $V_{REF}$ and the charged voltages $V_{DL1} \sim V_{DLp}$ on the data lines $DL_1 \sim DL_p$. The p output signals $D_{O1} \sim D_{Op}$ can be used to indicate the storing states of the p selected memory cells in the selected row.

Moreover, in the fifth embodiment and the sixth embodiment, each of the sense amplifiers 900 and 950 further comprises two capacitors $C_{b1}$ and $C_{b1}$. When the enabled single EN is activated, the transistor $M_{N3}$ is turned on. Consequently, the voltage at the node m changes quickly (i.e., drops quickly), and the capacitive coupling effect is generated. Since the voltage at the node m drops, two couple voltages of negative polarity are generated. The two couple voltages of negative polarity are respectively coupled to the data line DL and the reference voltage $V_{REF}$. Consequently, the voltage on the data line DL and the reference voltage $V_{REF}$ are decreased. When the enable signal EN is switched from the low-level state to the high-level state, the enable signal EN is activated. Consequently, two couple voltages of positive polarity are generated. In addition, the two couple voltages of positive polarity are respectively coupled to the data line DL and the reference voltage $V_{REF}$ through the two capacitors $C_{b1}$ and $C_{b1}$. The couple voltages of the positive polarity and the corresponding couple voltages of negative polarity are offset by each other. Consequently, the signal disturbance at the two input terminals of the sense amplifiers 900 will be reduced.

Of course, the sense amplifier in each of the above embodiments is further connected with an auxiliary circuit. For example, the auxiliary circuit has the circuitry structure of the auxiliary circuit 221 shown in FIG. 3A or the circuitry structure of the auxiliary circuit 251 shown in FIG. 4A. In the reset phase, the voltage at the data line is maintained in the initial voltage under control of the auxiliary circuit. At the moment when the reset phase is changed to the charging phase, the charged voltage on the data line starts to rise from the initial voltage.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A latch type sense amplifier for a non-volatile memory, a selected memory cell of the non-volatile memory being connected with a data line, the latch type sense amplifier comprising:
    a first transistor, wherein a first drain/source terminal of the first transistor is connected with a first node, a second drain/source terminal of the first transistor is connected with a second node, a gate terminal of the first transistor receives a reference voltage, and the gate terminal of the first transistor is a first input terminal of the latch type sense amplifier;
    a second transistor, wherein a first drain/source terminal of the second transistor is connected with the first node, a second drain/source terminal of the second transistor is connected with a third node, a gate terminal of the second transistor is connected with the data line, and the gate terminal of the second transistor is a second input terminal of the latch type sense amplifier
    a third transistor, wherein a first drain/source terminal of the third transistor receives a first supply voltage, a second drain/source terminal of the third transistor is connected with the first node, and a gate terminal of the third transistor receives an enable signal;
    a latching device connected with the second node and the third node;
    a first capacitor, wherein a first terminal of the first capacitor is connected with the gate terminal of the third transistor, and a second terminal of the first capacitor is connected with the gate terminal of the first transistor; and
    a second capacitor, wherein a first terminal of the second capacitor is connected with the gate terminal of the third transistor, and a second terminal of the second capacitor is connected with the gate terminal of the second transistor.

2. The latch type sense amplifier as claimed in claim 1, wherein a read cycle contains a charging phase and a sensing phase, wherein when the charging phase is switched to the sensing phase, the enable signal is activated, wherein when the enable signal is activated, a first couple voltage and a second couple voltage are respectively coupled to the first input terminal and the second input terminal of the sense amplifier according to a change of a voltage at the first node, and a third couple voltage and a fourth couple voltage are respectively coupled to the first input terminal and the second input terminal of the sense amplifier according to a change of the enable signal, wherein the first couple voltage and the third couple voltage are offset by each other, and the second couple voltage and the fourth couple voltage are offset by each other.

3. The latch type sense amplifier as claimed in claim 1, wherein the latching device:
    a fourth transistor, wherein a first drain/source terminal of the fourth transistor is connected with the second node, a second drain/source terminal of the fourth transistor receives a second supply voltage, and a gate terminal of the fourth transistor is connected with the third node; and
    a fifth transistor, wherein a first drain/source terminal of the fifth transistor is connected with the third node, a second drain/source terminal of the fifth transistor receives the second supply voltage, and a gate terminal of the fifth transistor is connected with the second node,
    wherein the second node or the third node is an output terminal of the latch type sense amplifier,
    wherein in a sensing phase of a read cycle, the latch type sense amplifier generates an output signal to indicate a storing state of the selected memory cell.

4. The latch type sense amplifier as claimed in claim 3, wherein the first transistor, the second transistor and the third transistor are p-type transistors, and the fourth transistor and the fifth transistor are n-type transistors, wherein a magnitude of the first supply voltage is higher than a magnitude of the second supply voltage.

5. The latch type sense amplifier as claimed in claim 3, wherein the first transistor, the second transistor and the third transistor are n-type transistors, and the fourth transistor and the fifth transistor are p-type transistors, wherein a magnitude of the first supply voltage is lower than a magnitude of the second supply voltage.

6. The latch type sense amplifier as claimed in claim 1, wherein the latching device:
   a fourth transistor, wherein a first drain/source terminal of the fourth transistor is connected with the second node, a second drain/source terminal of the fourth transistor is connected with a fourth node, and a gate terminal of the fourth transistor is connected with a fifth node;
   a fifth transistor, wherein a first drain/source terminal of the fifth transistor is connected with the third node, a second drain/source terminal of the fifth transistor is connected with the fifth node, and a gate terminal of the fifth transistor is connected with the fourth node;
   a sixth transistor, wherein a first drain/source terminal of the sixth transistor is connected with the fourth node, a second drain/source terminal of the sixth transistor receives a second supply voltage, and a gate terminal of the sixth transistor is connected with the fifth node;
   a seventh transistor, wherein a first drain/source terminal of the seventh transistor is connected with the fifth node, a second drain/source terminal of the seventh transistor receives the second supply voltage, and a gate terminal of the seventh transistor is connected with the fourth node;
   wherein the fourth node or the fifth node is an output terminal of the latch type sense amplifier,
   wherein in a sensing phase, the latch type sense amplifier generates an output signal to indicate a storing state of the selected memory cell.

7. The latch type sense amplifier as claimed in claim 6, wherein the first transistor, the second transistor, the third transistor, the fourth transistor and the fifth transistor are p-type transistors, and the sixth transistor and the seventh transistor are n-type transistors, wherein a magnitude of the first supply voltage is higher than a magnitude of the second supply voltage.

8. The latch type sense amplifier as claimed in claim 6, wherein the first transistor, the second transistor, the third transistor, the fourth transistor and the fifth transistor are n-type transistors, and the sixth transistor and the seventh transistor are p-type transistors, wherein a magnitude of the first supply voltage is lower than a magnitude of the second supply voltage.

9. The latch type sense amplifier as claimed in claim 1, wherein the latch type sense amplifier further comprises an auxiliary circuit, and the auxiliary circuit is connected with the data line, wherein in a reset phase of a read cycle, a voltage at the data line is maintained in an initial voltage under control of the auxiliary circuit.

10. The latch type sense amplifier as claimed in claim 9, wherein the auxiliary circuit comprises a fourth transistor, wherein a first drain/source terminal of the fourth transistor is connected with the data line, a second drain/source terminal of the fourth transistor receives a ground voltage, and a gate terminal of the fourth transistor receives a reset signal, wherein in the reset phase, the reset signal is activated, the fourth transistor is turned on, and the data line is discharged to the ground voltage, wherein the ground voltage is equal to the initial voltage.

11. The latch type sense amplifier as claimed in claim 1, wherein the latch type sense amplifier further comprises an auxiliary circuit, and the auxiliary circuit is connected with the data line, wherein in a pre-charge phase of a read cycle, a voltage at the data line is maintained in the first supply voltage under control of the auxiliary circuit, wherein after the pre-charge phase and in a reset phase of the read cycle, the voltage at the data line is maintained in an initial voltage under control of the auxiliary circuit.

12. The latch type sense amplifier as claimed in claim 11, wherein the auxiliary circuit comprises a fourth transistor and a fifth transistor, wherein a first drain/source terminal of the fourth transistor is connected with the data line, a second drain/source terminal of the fourth transistor receives a ground voltage, a gate terminal of the fourth transistor receives a reset signal, a first drain/source of the fifth transistor is connected with the data line, a second drain/source terminal of the fifth transistor receives the first supply voltage, and a gate terminal of the fifth transistor receives a pre-charge signal, wherein in the pre-charge phase, the pre-charge signal is activated, and the fifth transistor is turned on, so that the data line is pre-charged to the first supply voltage, wherein in the reset phase, the reset signal is activated, and the fourth transistor is turned on, so that the data line is discharged to the ground voltage, wherein the ground voltage is equal to the initial voltage.

* * * * *